United States Patent
Wang et al.

(10) Patent No.: US 6,972,593 B1
(45) Date of Patent: Dec. 6, 2005

(54) METHOD AND APPARATUS FOR PROTECTING A CIRCUIT DURING A HOT SOCKET CONDITION

(75) Inventors: Xiaobao Wang, Santa Clara, CA (US); Khai Nguyen, San Jose, CA (US); Chiakang Sung, Milpitas, CA (US); Bonnie Wang, Cupertino, CA (US)

(73) Assignee: Altera Corp., San Jose, CA (US)

( * ) Notice: Subject to any disclaimer, the term of this patent is extended or adjusted under 35 U.S.C. 154(b) by 150 days.

(21) Appl. No.: 10/635,625

(22) Filed: Aug. 5, 2003

(51) Int. Cl.[7] .......................................... H03K 19/094

(52) U.S. Cl. .............................. 326/56; 326/57; 326/80

(58) Field of Search ................. 326/56–58, 80–83

(56) References Cited

U.S. PATENT DOCUMENTS

| | | | | |
|---|---|---|---|---|
| 6,040,712 A | * | 3/2000 | Mejia | 326/82 |
| 6,154,845 A | | 11/2000 | Ilkbahar et al. | 713/300 |
| 6,549,032 B1 | | 4/2003 | Shumareyev et al. | 326/33 |
| 6,630,844 B1 | * | 10/2003 | Chong et al. | 326/82 |
| 6,810,458 B1 | * | 10/2004 | Bazargan et al. | 710/302 |

OTHER PUBLICATIONS

U.S. Appl. No. 09/887,688, filed Aug. 21, 2001, Chong et al.

* cited by examiner

*Primary Examiner*—Anh Q. Tran

(57) ABSTRACT

The hot socket detect circuit of the present invention includes a well bias circuit and three hot socket detect blocks. If the output of any of the three hot socket detect blocks is a digital high signal then the output of the hot socket detect circuit is a digital high signal. The digital high signal indicates that a hot socket condition exists.

19 Claims, 7 Drawing Sheets

METHOD AND APPARATUS FOR PROTECTING A CIRCUIT DURING A HOT SOCKET CONDITION

BACKGROUND OF THE INVENTION

This invention relates generally to integrated circuits. More particularly, this invention relates to a dynamic hot socket protection circuit for use in mixed-voltage systems.

Digital systems are commonly embedded on printed circuit boards. Different integrated circuits positioned on a printed circuit board may operate at different voltages. For example, with improvements in process technology, integrated circuits use lower power supply voltages, such as 3.3 Volts, 2.5 Volts, 1.8 Volts, or even lower. Integrated circuits made with these processes should remain compatible with previous generations of integrated circuits.

For example, a new generation 3.3 Volt integrated circuit may need to be used on a printed circuit board with an old generation 5 Volt integrated circuit. Systems of this type are commonly referred to as mixed-voltage systems. The 3.3 Volt integrated circuit will need to have the proper supply and input voltages for operation. In addition, the 3.3 Volt integrated circuit should supply or generate the proper output voltages for interfacing with the other integrated circuits.

Proper interfacing of the integrated circuits is essential for proper functional operation. Further, proper interfacing will prevent undesirable conditions, such as overstressing the devices, avoiding possible high current or latch-up conditions, and other similar concerns, thereby improving device longevity.

Many circuit architectures in mixed-voltage systems rely upon separate noisy and quiet supply voltage schemes. For example, an I/O driver may be coupled to a noisy supply while the on-chip conversion circuitry is coupled to the quiet supply. By separating the power supplies in this fashion, the circuitry connected to the quiet power supply is isolated somewhat from switching and other types of noise present on the noisy power supply.

Sometimes it is necessary to remove a circuit from a mixed-voltage system without shutting off the power within the system. This situation is referred to as a "hot socket" insertion. This situation arises frequently in systems that must be up 24 hours a day, 7 days a week. If not properly designed, a chip can interfere with the rest of the system during a hot socket insertion. Problems arise because as the chip is inserted, a race condition exists between the power pins and the input/output pins. If system signals reach the chip input/outputs before the system power reaches the chip's power pins (commonly referred to as a "hot socket condition"), the input/outputs may behave erratically, thereby causing a disturbance to the system. The disturbance can range from an inconsequential glitch to one that disables the system.

In view of the foregoing, it would be highly desirable to provide a mechanism to identify a hot socket condition, and thereafter isolate the output pins of the affected circuit until the hot socket condition is completed.

SUMMARY OF THE INVENTION

The method and apparatus of the present invention isolates the output pad of an integrated circuit during a hot socket condition.

A circuit of the present invention includes an output node having an output voltage, a set of transistors that control the signal level on the output node. The circuit further includes a quiet voltage supply providing a quiet voltage, a noisy voltage supply providing a noisy voltage and a pre-driver voltage supply. The pre-driver voltage supply is used to power the pre-drivers that control the set of transistors. Preferably, the pre-driver voltage has a higher value than either the quiet voltage or the noisy voltage.

The circuit further includes a hot socket detect circuit to identify when the quiet, noisy or pre-driver voltage supply is below a predetermined value indicative of a hot socket condition. The hot socket detect circuit includes a well bias circuit and three hot socket detect blocks. If the output of any of the three hot socket detect blocks is a digital high signal then the output of the hot socket detect circuit is a digital high signal. The digital high signal indicates that a hot socket condition exists.

The method of the implementation includes controlling an integrated circuit output signal during a hot socket condition where the integrated circuit includes first, second and third input voltage signals. The third input voltage signal is greater than either the first or the second input voltage signal. The integrated circuit further has an output voltage at an output pad of the integrated circuit.

The method may further include determining a VWELL voltage, the VWELL voltage being the highest of the output voltage, the first voltage, and the third voltage. Next, determining a HOT1 signal using the VWELL voltage and the third voltage. And determining a HOT2 signal using second and third voltages. And determining a HOT3 signal using the first and third voltages. A hot socket condition is indicated if either the HOT1 or the HOT2 or the HOT3 signal is a digital high signal.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The circuit of the present invention turns off the output buffer during a hot socket condition. The circuit includes a hot socket detect circuit that detects a hot socket condition and sends out a signal indicating a hot socket condition. The hot socket detect circuit includes a well bias circuit and three hot socket detect blocks. If the output of any one of the three hot socket detect blocks is a digital high signal then the output of the hot socket detect circuit is a digital high signal. The digital high signal indicates that a hot socket condition exists.

Figure 1:
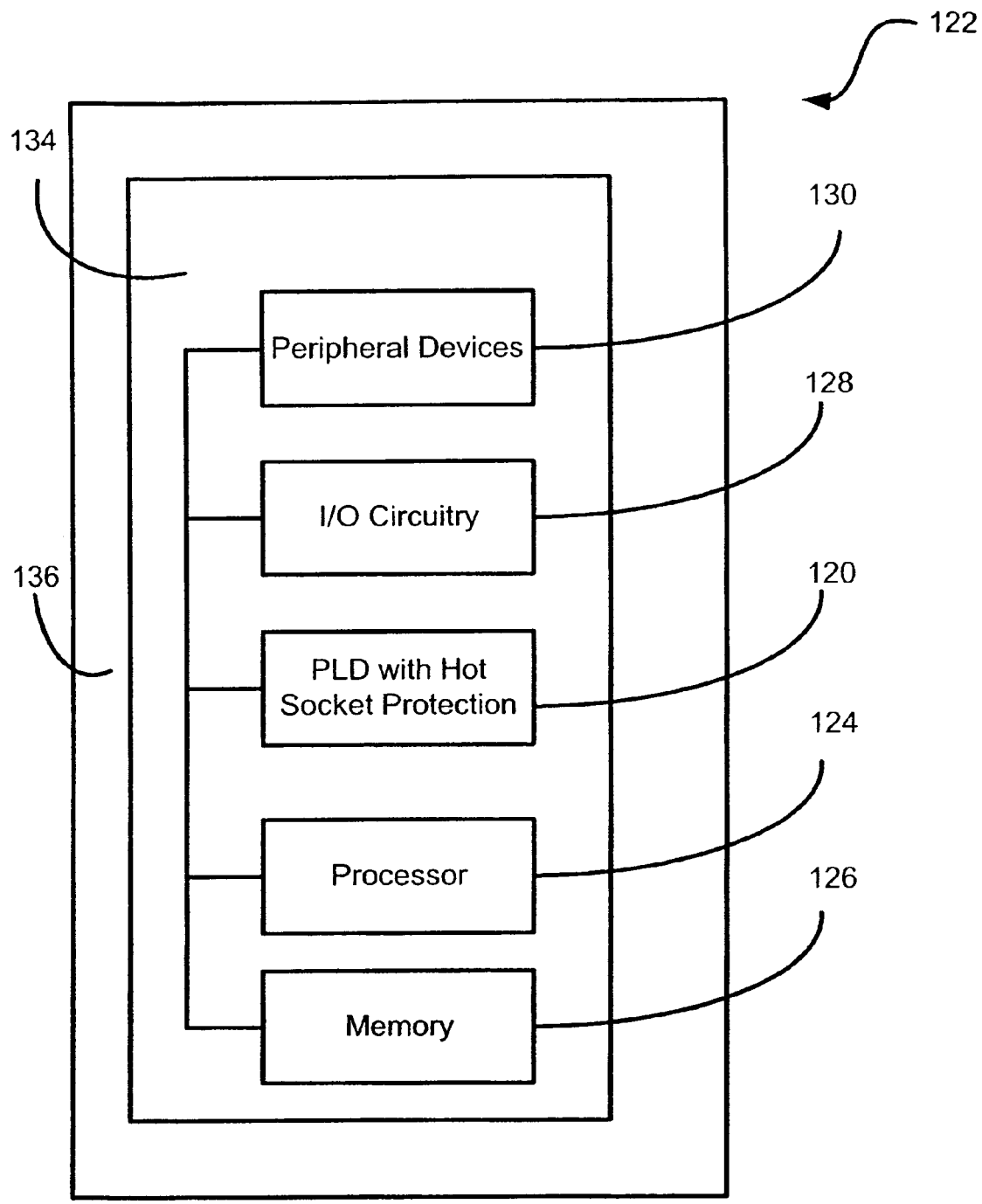
FIG. 1 illustrates a programmable logic device that incorporates an output buffer in accordance with the invention.

FIG. 1 illustrates a programmable logic device (PLD) 120 incorporating an output buffer in accordance with the invention. PLDs are integrated circuits that provide the advantages of fixed integrated circuits with the flexibility of custom integrated circuits. Such devices are currently represented by, for example, Altera's Stratix and Stratix GX series of PLDs. The present invention may be used with PLDs such as PALs, PLAs, FPLAs, CPLDs, EPLDs, EEPLDs, LCAs, or FPGAs. Additionally, the present invention may also be used in other types of integrated circuits that need hot socket protection such as ASICS, ASSPs and the like.

The PLD 120 forms part of a data processing system 122. The data processing system 122 may include one or more of the following components: a processor 124, a memory 126, input/output circuitry 128, and peripheral devices 130. These components are coupled together by a system bus 132 and are populated on a circuit board 134, which is contained in an end-user system 136.

The system 122 can be used in a wide variety of applications, such as computer networking, data networking, instrumentation, video processing, digital signal processing, or any other application where the advantage of using re-programmable logic is desirable. The PLD 120 can be used to perform a variety of logic functions. For example, the PLD 120 can be configured as a processor or controller that works in cooperation with processor 124. In yet another example, the PLD 120 can be configured as an interface between the processor 124 and one of the other components in the system 122.

There are instances when the PLD 120 must be replaced while the remaining components in the system 122 remain operative, commonly referred to as a hot socket condition. The present invention is directed toward solving problems that arise during a hot socket condition.

During hot socket insertion of a PLD 120, a race condition is created between the power pins and the input/output pins of the PLD 120. If system signals reach the PLD input/output pins before the system power reaches the chip's power pins, the input/outputs may create disturbances in the remainder of the system 122. The present invention prevents this problem in PLDs and other integrated circuits that operate with mixed voltages.

Figure 2:
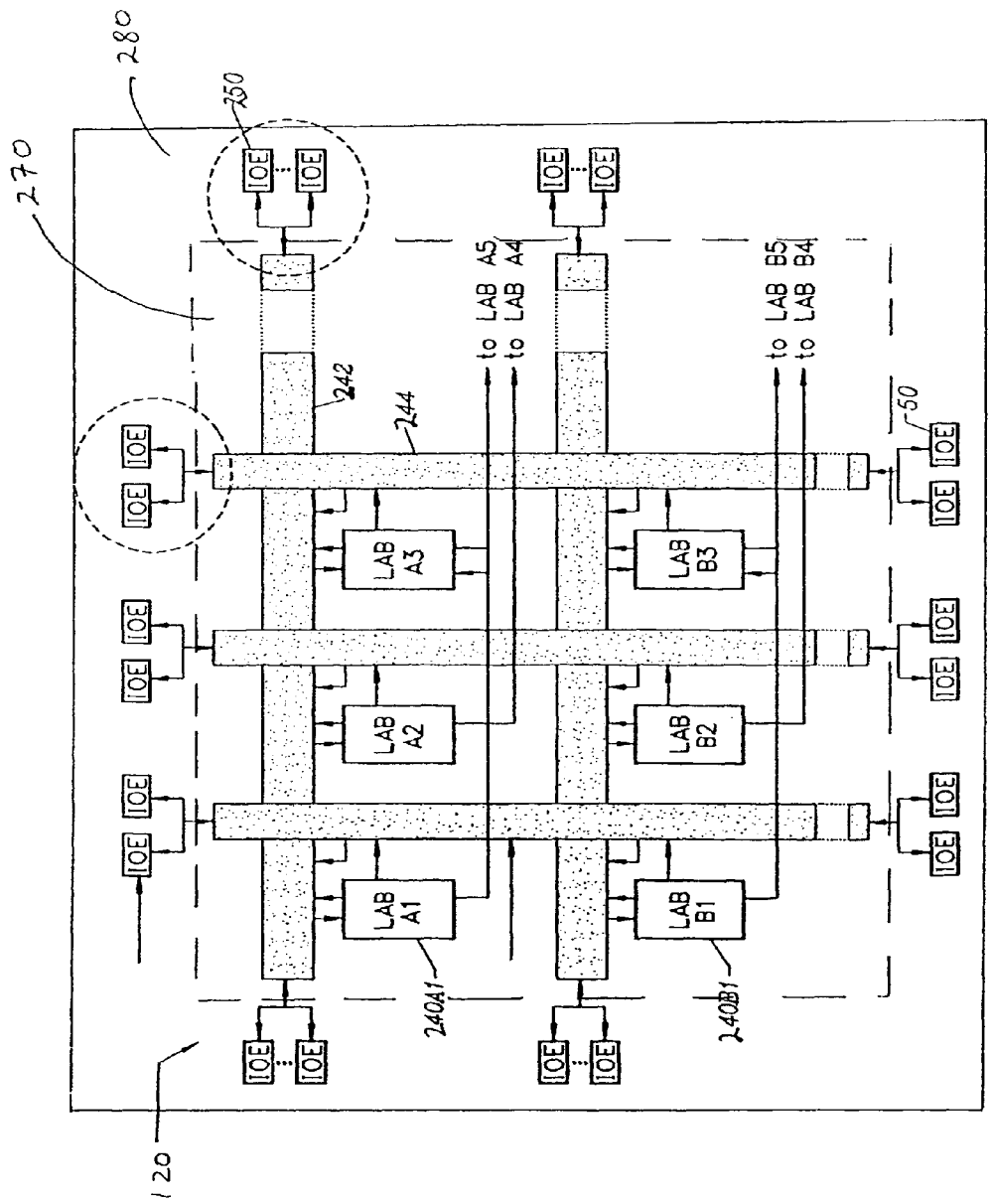
FIG. 2 illustrates a programmable logic device in accordance with the invention.

FIG. 2 illustrates a programmable logic device 120 in accordance with the invention. The programmable logic device 120 includes a set of logic array blocks 240. As known in the art, a logic array block 240 performs programmed logic operations. Row interconnect circuitry 242 and column interconnect circuitry 244 link the various logic array blocks 240. Row interconnect circuitry 242 and column interconnect circuitry 244 are well known in the art. The invention may be constructed using logic array blocks 240, row interconnect circuitry 242, and column interconnect circuitry 244 of the type used in the Stratix and Stratix GX families of PLDs sold by Altera Corporation, San Jose, Calif.

Input/output elements 250 are positioned at the ends of the row interconnect circuitry 242 and column interconnect circuitry 244. The input/output elements 250 are used for standard input/output functions. The input/output elements 250 include input buffers and output buffers. The input buffers may be implemented using prior art architectures. The output buffers are constructed in accordance with the invention. As described below, the output buffers are configured such that they are shut-off during a hot socket condition. Thus, the output buffers do not create erroneous signals that can affect system performance when a hot socket condition exists.

The output buffer of the invention is implemented in a semiconductor (chip) used in a mixed-voltage environment. That is, the output buffer of the invention relies upon a quiet or internal voltage supply (VCCQ), a noisy or input/output voltage supply (VCCN) and a pre-driver voltage supply (VCCPD). The circuit of the invention also relies upon a third voltage, VCCPD. The VCCQ is used to power the core 270 of the programmable logic device 120, the VCCN powers the periphery 280 of the PLD 120 and the VCCPD powers the pre-drivers of the output buffers of the PLD 120.

Figure 3:
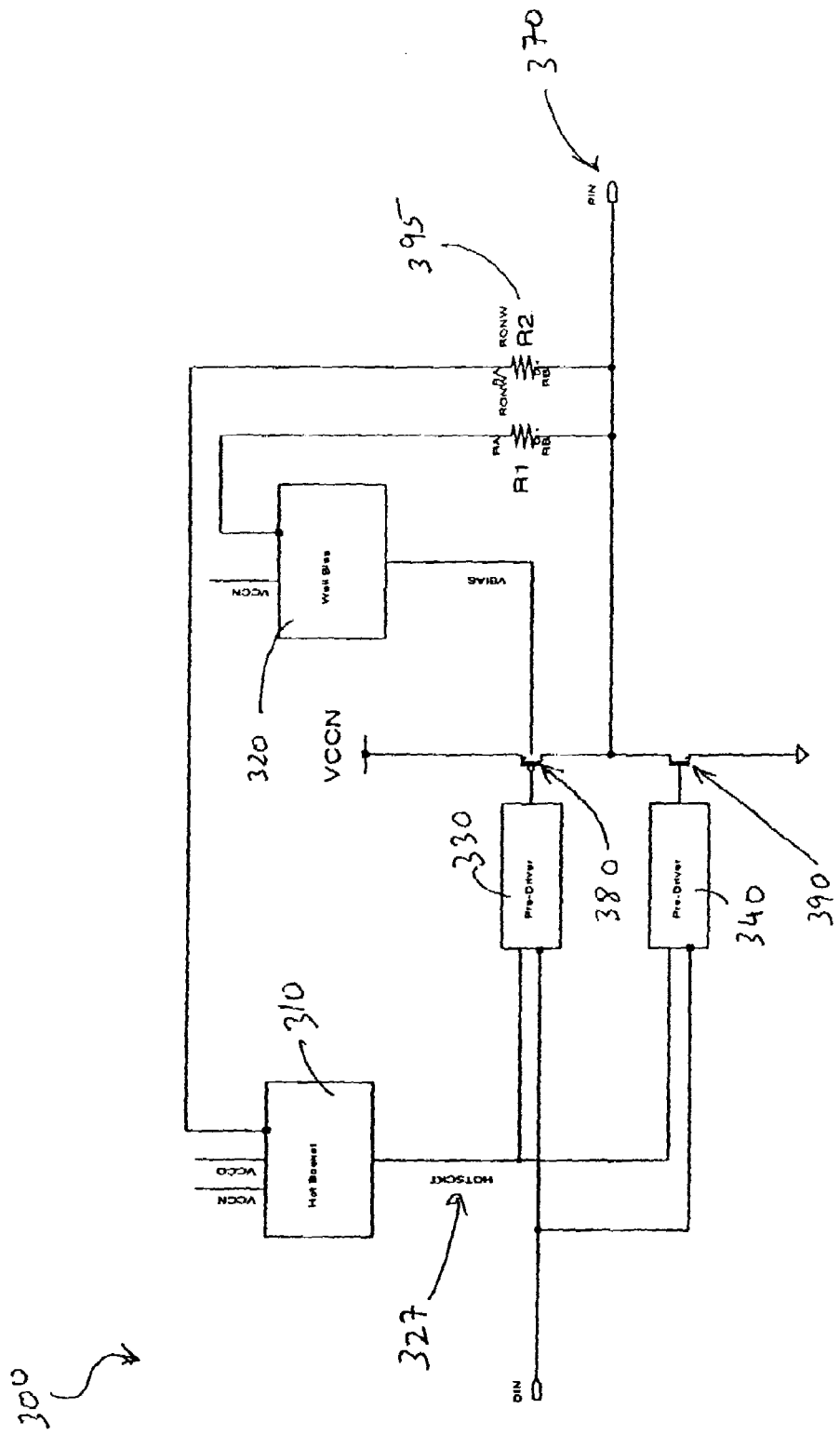
FIG. 3 illustrates an exemplary prior art output buffer.

FIG. 3 illustrates an exemplary prior art output buffer. The output buffer 300 is of the type used in, for example, the Stratix and Stratix GX families of PLDs sold by Altera Corporation. Output buffer 300 is configured such that the circuit 300 is shut-off during a hot socket condition.

Buffer 300 includes a hot socket detect circuit 310, a well bias circuit 320, and pre-drivers 330, 340. The hot socket detect circuit 310 receives three inputs VCCQ, VCCN, and PIN. PIN is the voltage at the IO pin 370. Based on these signals, the circuit 310 determines whether a hot socket condition exists.

Well bias circuit 320 pulls the voltage VBIAS to the higher of VCCN and PIN. VBIAS is used to minimize the leakage current between pin 370 and the PMOS transistor 380. The pre-drivers 330 and 340 control the gate signal at the PMOS and NMOS transistors, respectively and thereby can be used to override the signal from core logic at pin 370. The PMOS 380 and NMOS 390 transistors control the digital signal on the output pin 370 of the circuit 300.

The hot socket circuit 310 has three inputs: VCCN, VCCQ and PIN. PIN is the voltage at the IO pin 370. When both VCCN and VCCQ are high, the hot socket signal is low. Thereby, indicating that a hot socket condition does not exist and the PLD continues to perform its normal operations. If, however, VCCN and VCCQ are not both high then the hot socket signal is high, indicating that a hot socket condition exists and the output buffer 300 is shut-off in order to minimize interference with the other components in the system. During a hot socket condition, the voltage of the hot socket signal HOTSCKT 327 is the higher of VCCN and PIN.

When the voltage of the hot socket circuit is high, the pre-driver of the NMOS gate pulls the NMOS voltage to ground and the pre-driver of the PMOS gate pulls the voltage of the PMOS gate to the higher of VCCN and PIN. The PMOS sits in a floating well controlled by the well bias circuit, the well bias circuit pulls the bulk of the PMOS to the higher voltage of VCCN and PIN. Thereby, turning off both the PMOS and NMOS transistors.

Figure 4:
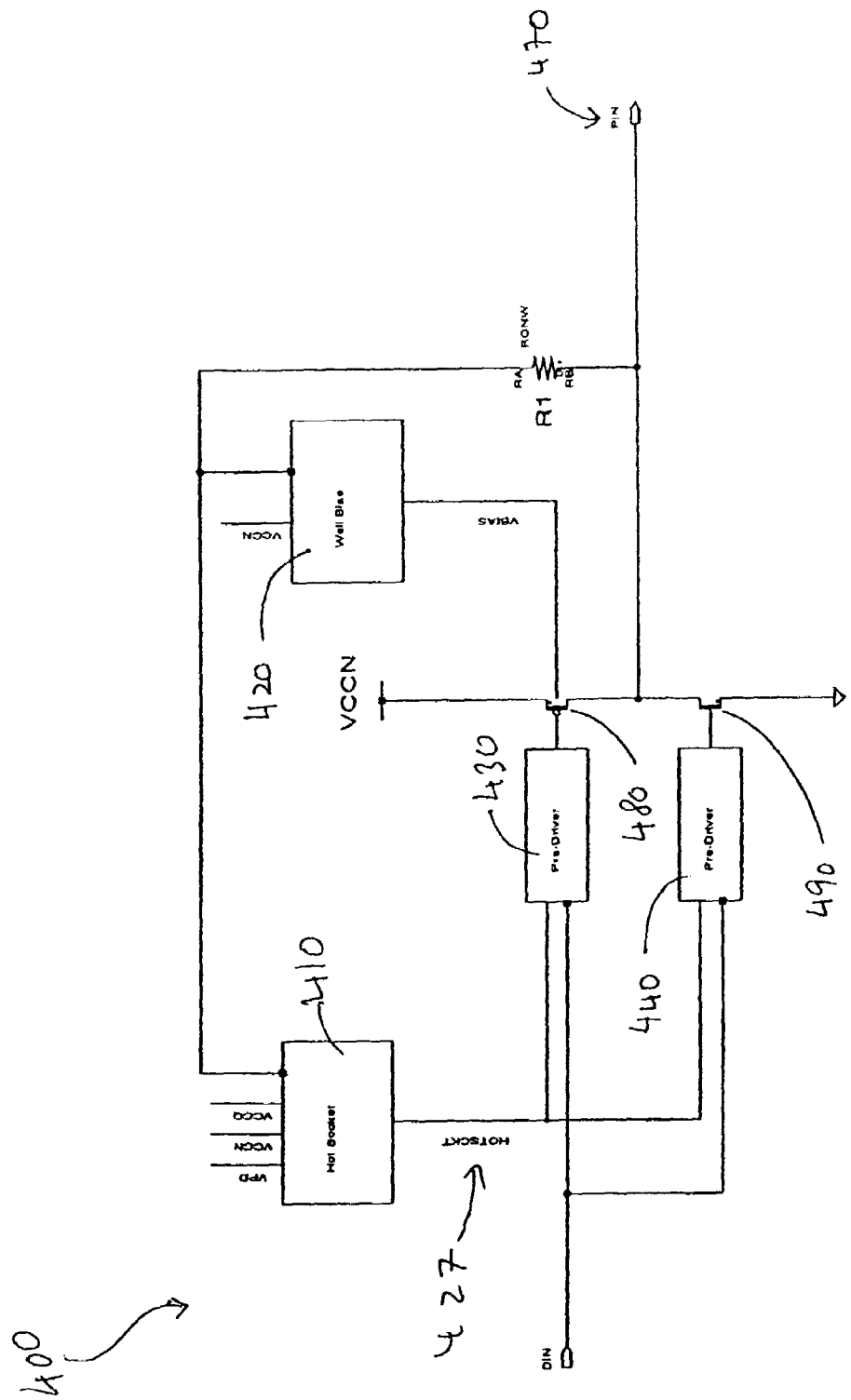
FIG. 4 illustrates a hot socket detect circuit in accordance with an embodiment of the invention.

FIG. 4 shows the block diagram of a hot socket circuit that uses the output buffer of the present invention. The PLD incorporating this buffer has three power sources: VCCN, VCCQ and VCCVD. In the hot socket circuit of FIG. 3, the pre-driver and the periphery circuitry were both powered by VCCN. Therefore, the acceptable values for VCCN are constrained by the voltage requirements at the various IO ports. Thus, the VCCN value may not be optimum for the PMOS and NMOS transistor operation.

By providing a separate voltage for the pre-drivers, this constraint is removed and an optimum voltage value for the pre-drivers can be selected, leading to higher speed and reduced die size. Introducing VCCPD and selecting the voltage of the VCCPD to be the same as that of the PMOS and NMOS transistors leads to a more efficient transistor operation, thereby increasing the speed of the device. Preferably, VCCPD is higher than or equal to VCCN or VCCQ (i.e. VCCPD=3.3 Volts, VCCQ=1.2–1.5 Volts and VCCN=1.5–3.3 Volts). Preferably, the VCCPD is 3.3 volts and the PMOS and NMOS transistors are designed for 3.3 volts.

Additionally, in the hot socket circuit of FIG. 3, there is a leakage current path from VWELL to VCCN. Therefore, a second ESD resistor 395 is needed to isolate the hot socket block 310 and the well bias circuit 320. However, by introducing a third voltage source and selecting the value of the third voltage source to be the highest values of all three voltage sources eliminates the need for the ESD transistor. Because the value of the third voltage source will always be greater than or equal to VWELL, thereby eliminating the leakage current.

Buffer 400 includes a hot socket detect circuit 410, a well bias circuit 420, and pre-drivers 430, 440. The hot socket detect circuit 410 receives four inputs VCCPD, VCCQ, VCCN, and PIN. PIN is the voltage at the IO pin 470. Based on these signals, the circuit 410 determines whether a hot socket condition exists. Well bias circuit 420 pulls the voltage VWELL to the highest of VCCN and PIN. The pre-drivers 430 and 440 control the gate signal at the PMOS and NMOS transistors and thereby can be used to override the signal from core logic or pin 470. The PMOS and NMOS transistors control the digital signal on the output pin 470 of the circuit 400.

When VCCPD, VCCN and VCCQ are high, the hot socket signal HOTSCKT 427 is low. Thereby indicating that a hot socket condition does not exist. If VCCPD, VCCN and VCCQ are not all high then the hot socket signal is high, indicating that a hot socket condition exists. During a hot socket condition, the voltage of the hot socket signal is the highest of VCCPD, VCCN and PIN.

When the voltage of the hot socket circuit is high, the pre-driver of the NMOS gate pulls the NMOS voltage to ground and the pre-driver of the PMOS gate pulls the voltage of the PMOS gate to the higher of VCCPD, VCCN and PIN. The PMOS sits in a floating well controlled by the well bias circuit, the well bias circuit pulls the bulk of the PMOS to the higher voltage of VCCN and PIN. Thereby turning off both the PMOS and NMOS transistors.

Figure 5:
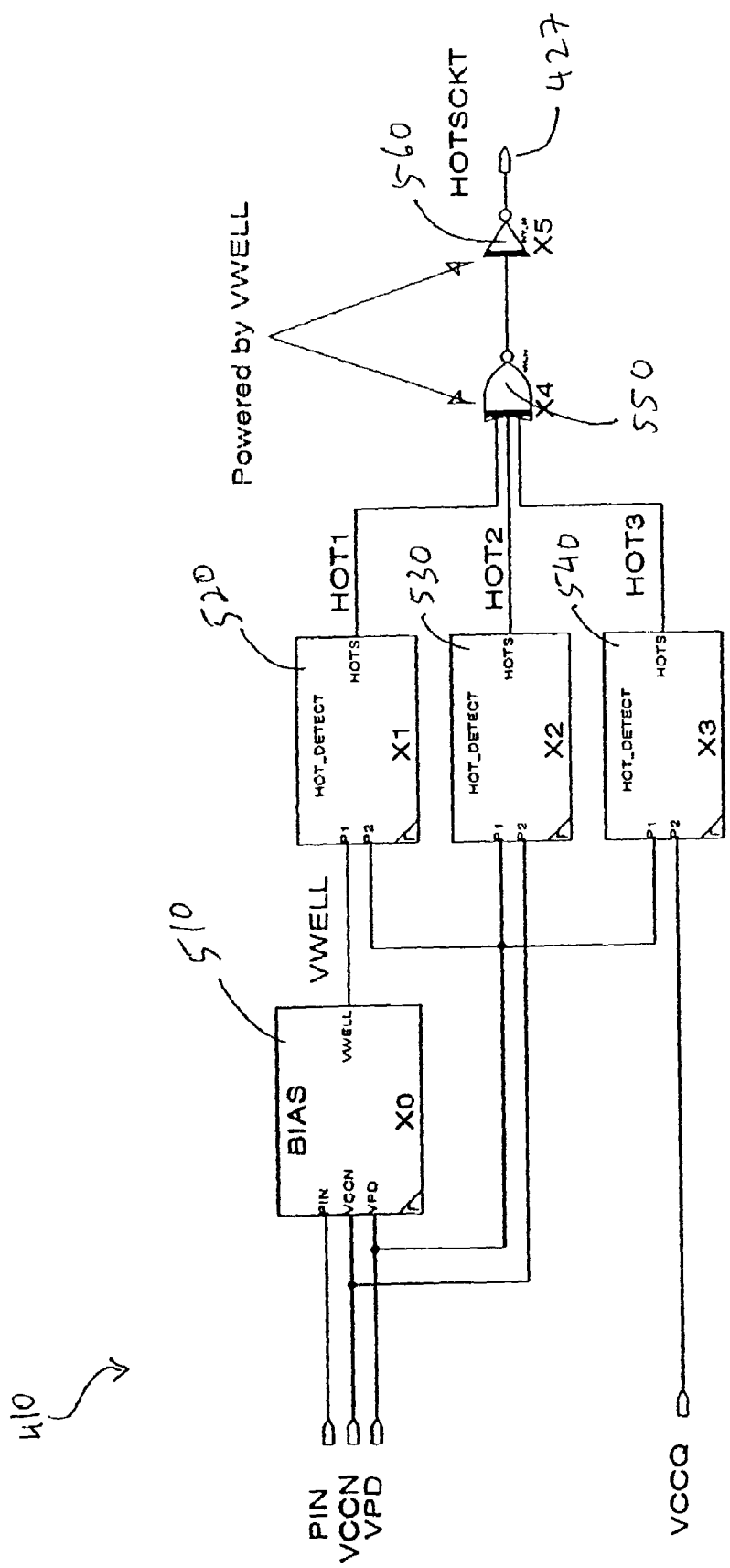
FIG. 5 illustrates a hot socket detect circuit in accordance with an embodiment of the invention.

FIG. 5 illustrates one possible implementation of a hot socket detect circuit 410 in accordance with an embodiment of the invention. The hot socket detect circuit 410 comprises a well bias circuit 510 and three hot socket detecting blocks 520, 530 and 540. The hot socket detect circuit 510 has four inputs: VCCPD, VCCN, VCCQ and PIN. The device is in hot socket condition when the output HOTSCKT 427 of the hot socket detect circuit 410 is high.

The well bias circuit 510 has three inputs: PIN, VCCN and VCCPD. The output of the well bias circuit 510 is the highest of the three inputs: PIN, VCCPD or VCCN. The well bias circuit 510 is described in greater detail below in connection with FIG. 6. Each of the three hot socket detect blocks, 520, 530, and 540, has two inputs P1 and P2 and an output HOTS. If P2 is low then HOTS is equal to P1. If P2 is high then HOTS is low. The outputs from each of the three hot socket detect blocks is input to an NOR gate 550. And the output of the NOR gate 550 is input to the inverter 560 which then outputs the final HOTSCKT signal 427. The hot socket blocks, 520, 530 and 540, are described in greater detail below in connection with FIG. 7. The NOR gate 550 and inverter 560 are powered by VWELL so that when any of the three pins: VCCN, VCCPD, or PIN is high, the NOR gate 550 and the inverter 560 have power.

Figure 6:
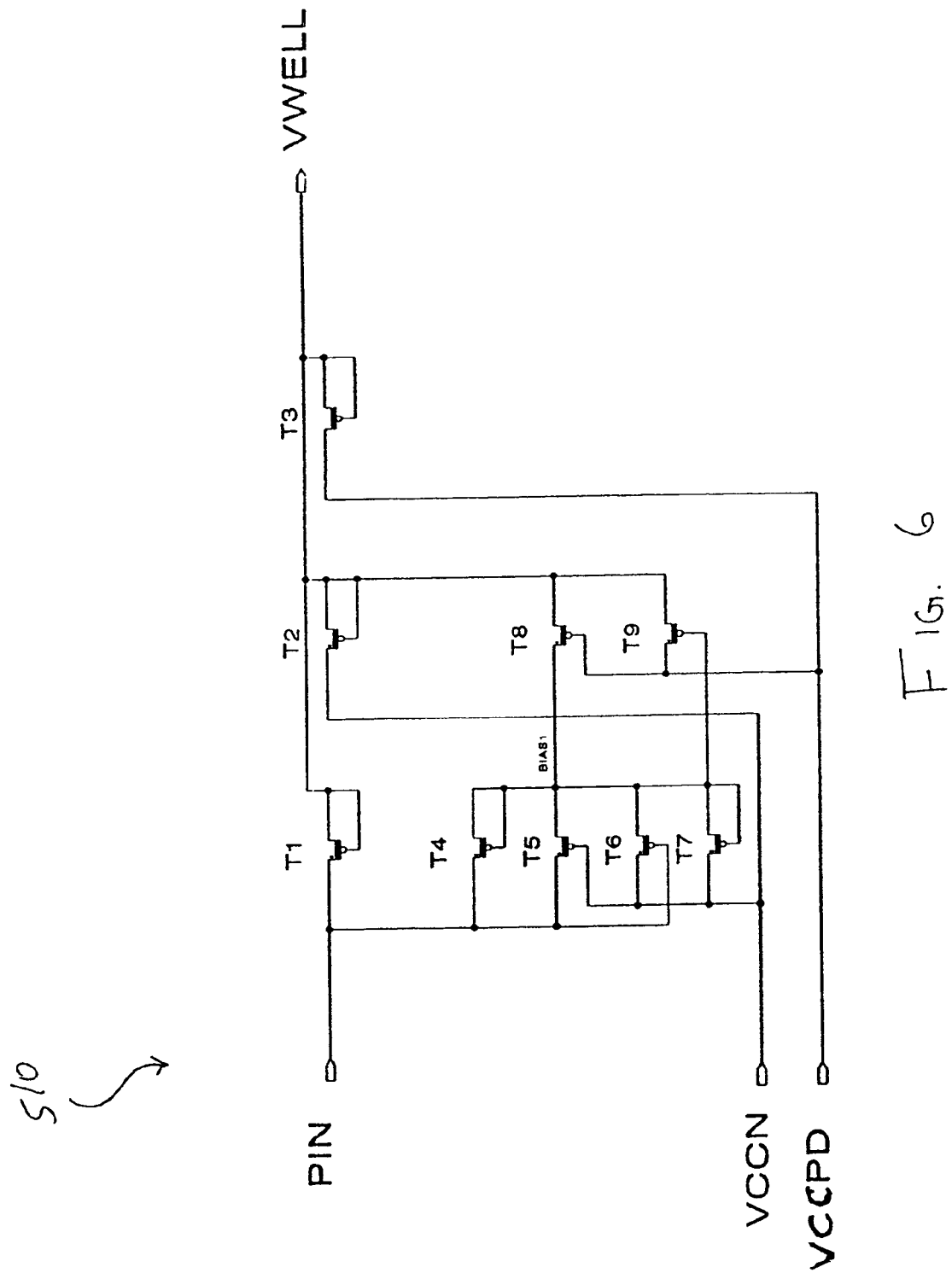
FIG. 6 shows an exemplary circuit implementation of a well bias block in accordance with an embodiment of the invention.

FIG. 6 shows an exemplary circuit implementation of a well bias block 510 in accordance with an embodiment of the invention. The well bias circuit 510 consists of 9 PMOS transistors T1–T9. Transistors T4–T9 pull VWELL to the highest level among VCCN, PIN and VCCPD. First transistors T4–T7 pull node BIAS 1 to the higher of VCCN and PIN voltages. Then transistors T8–T9 pull VWELL to the higher of the BIAS1 and VCCPD voltages. Thereby generating an output VWELL which is the highest of the VCCN, PIN and VCCPD voltages. In the case where VCC, VCCPD and PIN are equal to each other, the T1–T3 transistors pull VWELL to a predetermined voltage. Preferably, the T1–T3 transistors pull the VWELL voltage to VCCN-Vt where Vt is a transistor threshold voltage.

Figure 7:
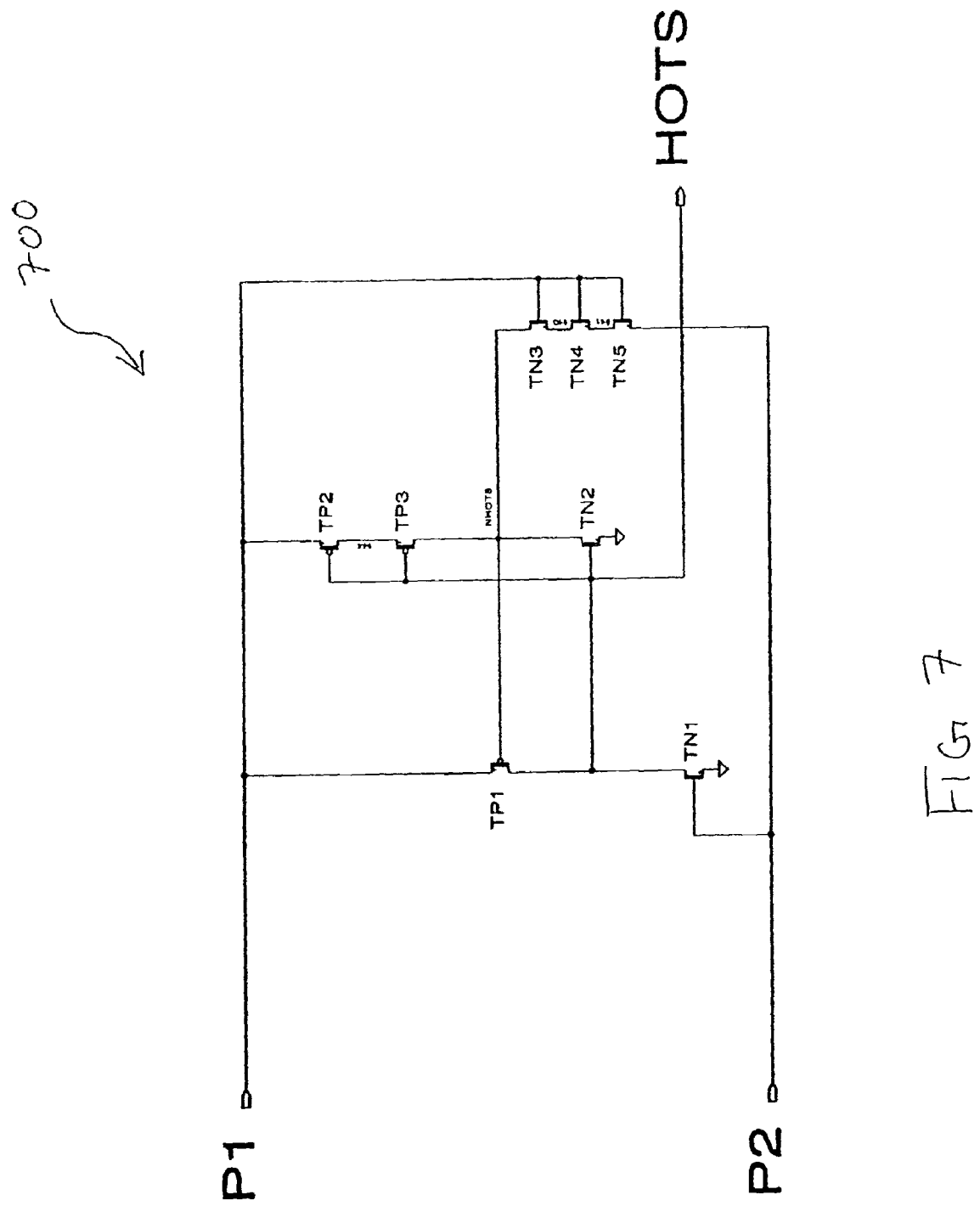
FIG. 7 shows an exemplary circuit implementation of a hot socket detect block in accordance with an embodiment of the invention.

FIG. 7 shows an exemplary circuit implementation of a hot socket detect block in accordance with an embodiment of the invention. The hot socket detect block 700 is any one of the hot sockets blocks 520, 530 and 540. Hot socket block 700 has two inputs P1 and P2 and an output HOTS. Transistors TP1–3 and TN2 form a latch.

When P2 is a digital low signal, the transistor TN1 is off. Transistors TN3–5 pulls NHOTS 710 to a digital low which results in a digital high signal at HOTS. When P2 is a digital high signal, the transistor TN1 is on and pulls HOTS to a digital low signal.

Because P1 and P2 may have different voltage levels, there may be leakage paths between P1 and P2. Preferably, the sizes of the TN3–5 and TP2–3 are designed to minimize this leakage current. Preferably, the sized of TN3–5 and TP2–3 are selected such that the IO pin leakage current is less than $10\mu$. Preferably TN3–5 are much larger than TP2–3, giving the circuit a fast response time during a hot socket condition. Thus, the hot socket signal can be turned on quickly.

Thus, the circuit of the invention identifies a hot socket condition, and thereafter isolates an output pad until the hot socket condition is completed. Consequently, the invention provides a convenient mechanism for supporting hot socket replacement of semiconductors on a printed circuit board. Advantageously, the circuit of the invention is readily implemented with a relatively few number of standard electronic components.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention.

Thus, the foregoing descriptions of specific embodiments of the present invention are presented for purposes of illustration and description. They are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A circuit, comprising:
   an output node having an output voltage;
   a set of transistors operative to control the signal level on the output node;
   a quiet voltage supply providing a quiet voltage;
   a noisy voltage supply providing a noisy voltage;
   a pre-driver voltage supply, wherein the pre-driver voltage supply has a higher voltage than either the quiet voltage supply or the noisy voltage supply; and
   a hot socket detect circuit to identify when the quiet, noisy or pre-driver voltage supply is below a predetermined value indicative of a hot socket condition and in response thereto generating control signals that place the set of transistors in a high impedance state in response to the hot socket condition.

2. The circuit of claim 1 wherein the set of transistors comprise:
   a pull-up transistor connected to the output node; and
   a pull-down transistor connected to the output node.

3. The circuit of claim 2 wherein a first pre-driver is connected to the pull-up transistor and a second pre-driver is connected to the pull-down transistor, wherein the first and second pre-drivers control the voltage supplied to the pull-up and pull-down transistors; wherein the pre-driver voltage supply provides a pre-driver voltage to the first and second pre-drivers.

4. The circuit of claim 3 wherein the hot socket detection circuit passes the control signals to the first and second pre-drivers, and in response thereto, the first and second pre-drivers turn off the pull-up and pull-down transistors to establish the high impedance state.

5. The circuit of claim 4 wherein the hot socket detection circuit comprises:
   a control signal node;
   at least four input nodes, the input nodes including a pin node having as input the output voltage, a VCCQ node having as input the quiet voltage, a VCCN node having as input the noisy voltage and a VCCPD node having as input the pre-driver voltage;
   a well bias circuit having the pin, VCCN and VCCPD nodes as input nodes and a VWELL voltage at a VBIAS output node;
   a first, second and third hot socket detect block having an output HOT1, HOT2 and HOT3 respectively, each hot socket detect block having two input signals P1 and P2.

6. The circuit of claim 5 wherein the hot socket detection circuit further comprises an NOR gate having the HOT1, HOT2 and HOT3 as inputs and an inverter connected to the NOR gate, the inverter having as input an output of the NOR gate and a control signal as an output.

7. The circuit of claim 6 wherein the NOR gate and the inverter are powered by VWELL.

8. The circuit of claim 5 wherein the well bias circuit comprises
   a first group of transistors having inputs from the pin and the VCCN nodes, wherein the first group of transistors provide an output voltage BIAS1, BIAS1 being a higher voltage of voltages at the VCCN and pin nodes; and
   a second group of transistors having as inputs the BIAS1 voltage and a voltage at the VCCPD node, wherein the second group of transistors provide the output voltage VWELL, VWELL being a higher voltage of the BIAS1 voltage and the voltage at the VCCPD node.

9. The circuit of claim 5 wherein the first hot socket detect block inputs P1 and P2 are the VWELL voltage and VCCPD node voltage, wherein the output HOT1 is
   a digital low if P2 is a digital high; and
   a digital high if P2 is a digital low.

10. The circuit of claim 5 wherein the second hot socket detect block inputs P1 and P2 are VCCN and VCCPD node voltages, respectively, wherein the output HOT2 is
    a digital low if P2 is a digital high; and
    a digital high if P2 is a digital low.

11. The circuit of claim 5 wherein the third hot socket detect block inputs P1 and P2 are the VCCPD and VCCQ node voltages, wherein the output HOT3 is
    a digital low if P2 is a digital high; and
    a digital high if P2 is a digital low.

12. A programmable logic device, comprising:
    a plurality of logic array blocks;
    interconnect circuitry linking the plurality of logic array blocks; and
    a plurality of output buffers connected to the interconnect circuitry, at least one output buffer being the circuit of claim 1.

13. A printed circuit board on which is mounted a programmable logic device of claim 12.

14. The printed circuit board of claim 13 further comprising:
    memory circuitry mounted on the printed circuit board and coupled to the programmable logic device.

15. The printed circuit board of claim 14 further comprising
    Processing circuitry mounted on the printed circuit board and coupled to the memory circuitry.

16. A digital processing system comprising:
    processing circuitry;
    a memory coupled to the processing circuitry; and
    a programmable logic device of claim 12 coupled to the processing circuitry and the memory.

17. An integrated circuit device comprising the buffer of claim 1.

18. A method of controlling integrated circuit output signal during a hot socket condition wherein the integrated circuit includes first, second and third input voltage signals, wherein the third input voltage signal is greater than either the first or the second input voltage signal, the circuit further having an output voltage at an output pad of the integrated circuit, the method comprising:
    determining a VWELL voltage, the VWELL voltage being the highest of the output voltage, the first voltage, and the third voltage;
    determining a HOT1 signal using the VWELL voltage and the third voltage;
    determining a HOT2 signal using second and third voltages;
    determining a HOT3 signal using the first and third voltages;
    identifying a hot socket condition when either the HOT1 or HOT2 or HOT3 signal is a digital high signal.

19. The method of claim 18 wherein the first, second and third input voltages are a noisy voltage signal from a noisy voltage supply, a quiet voltage signal from a quiet voltage supply and a pre-driver voltage signal used to supply pre-drivers in a hot socket detect circuit, respectively.

* * * * *